(12) United States Patent
Pace

(10) Patent No.: US 7,271,028 B1
(45) Date of Patent: Sep. 18, 2007

(54) HIGH DENSITY ELECTRONIC INTERCONNECTION

(76) Inventor: Benedict G Pace, 2200 Smithtown Ave., Shoreham, NY (US) 11779

( * ) Notice: Subject to any disclaimer, the term of this patent is extended or adjusted under 35 U.S.C. 154(b) by 304 days.

(21) Appl. No.: 10/989,882

(22) Filed: Nov. 16, 2004

Related U.S. Application Data

(63) Continuation-in-part of application No. 09/737,407, filed on Dec. 15, 2000, now abandoned.

(60) Provisional application No. 60/170,975, filed on Dec. 15, 1999, provisional application No. 60/170,976, filed on Dec. 15, 1999.

(51) Int. Cl.
    *H01L 21/00* (2006.01)

(52) U.S. Cl. .................. 438/107; 438/27; 438/64; 438/125; 438/613; 257/E21.001

(58) Field of Classification Search ............... 438/613, 438/24–27, 64–67, 106, 108, 109, 107
    See application file for complete search history.

(56) References Cited

U.S. PATENT DOCUMENTS

| | | | |
|---|---|---|---|
| 3,663,184 A | 5/1972 | Wood et al. | |
| 4,742,023 A | 5/1988 | Hasegawa | |
| 5,347,710 A * | 9/1994 | Gall et al. | 29/830 |
| 5,627,406 A | 5/1997 | Pace | |
| 5,656,858 A | 8/1997 | Kondo et al. | |
| 5,744,752 A * | 4/1998 | McHerron et al. | 174/546 |
| 5,790,384 A * | 8/1998 | Ahmad et al. | 361/760 |
| 5,793,105 A | 8/1998 | Pace | |
| 5,866,441 A | 2/1999 | Pace | |
| 5,904,499 A | 5/1999 | Pace | |
| 5,953,814 A * | 9/1999 | Sozansky et al. | 29/840 |
| 5,969,418 A | 10/1999 | Belanger, Jr. | |
| 6,069,026 A * | 5/2000 | Terrill et al. | 438/109 |
| 6,077,725 A | 6/2000 | Degani et al. | |
| 6,159,837 A | 12/2000 | Yamaji et al. | |
| 6,165,820 A | 12/2000 | Pace | |
| 6,206,269 B1 * | 3/2001 | Olofsson | 228/123.1 |
| 6,388,264 B1 | 5/2002 | Pace | |
| 6,409,398 B2 * | 6/2002 | Nakaya et al. | 385/93 |
| 6,613,605 B2 | 9/2003 | Pace | |
| 6,614,110 B1 | 9/2003 | Pace | |

* cited by examiner

*Primary Examiner*—Michael Lebentritt
*Assistant Examiner*—Angel Roman
(74) *Attorney, Agent, or Firm*—John F McCormack

(57) ABSTRACT

This is an interconnection between electronic devices and other assemblies (e.g. printed circuits). The electronic devices are mounted on high temperature insulating bases, such as ceramic substrates. The insulating base has a conductive pattern to connect the electronic device to another assembly. The conductive pattern terminates in metal bumps capable of being connected to another assembly (e.g. a printed circuit) by a conductive adhesive or metallurgically by soldering, thermocompression, thermosonic or ultrasonic bonding. The bumps are formed by applying a metal with a melting point over 350° C. to contact pads of the conductive pattern of the insulating base, and raising the temperature of the base above the melting point of the metal causing the molten metal to draw back on to the contact pads forming a convex bump. In one embodiment metal bumps are formed on the conductive pattern of the lid of an electronic package and welded through a sealing layer to the ring frame of the package, and through the ring frame connected to the conductive pattern of the base of the package.

20 Claims, 14 Drawing Sheets

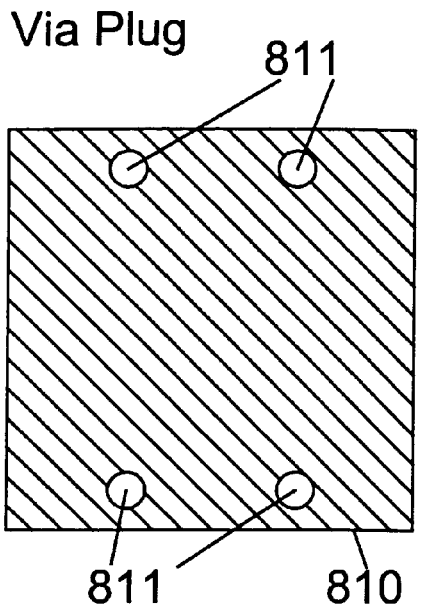
Fig. 8a
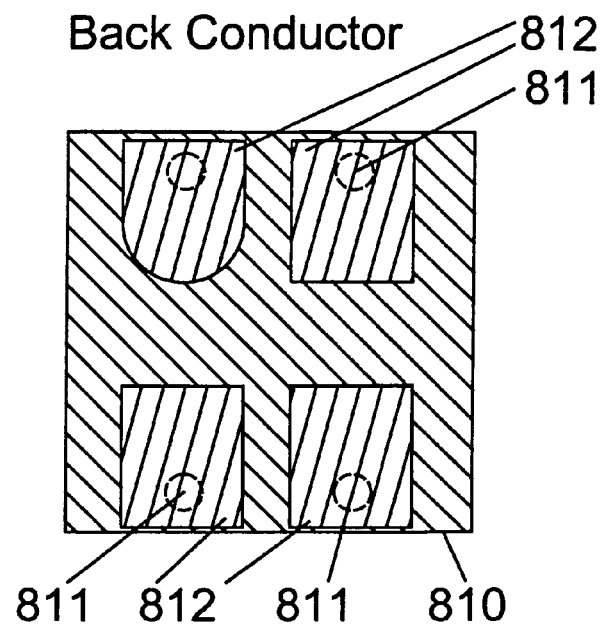
Fig. 8b
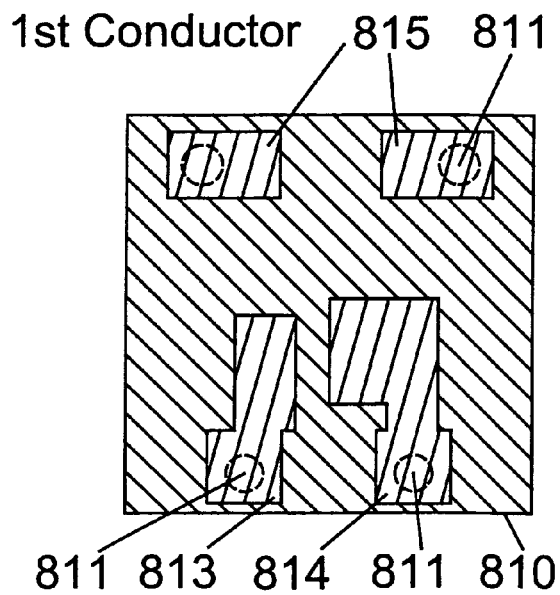
Fig. 8c
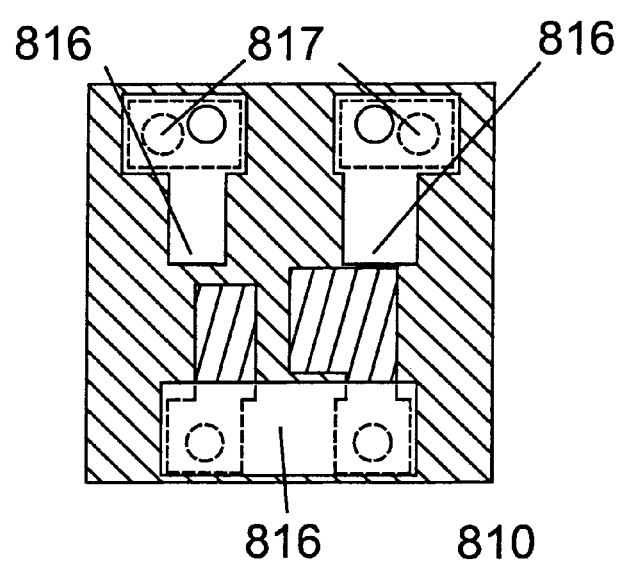
Fig. 8d
Fig. 8

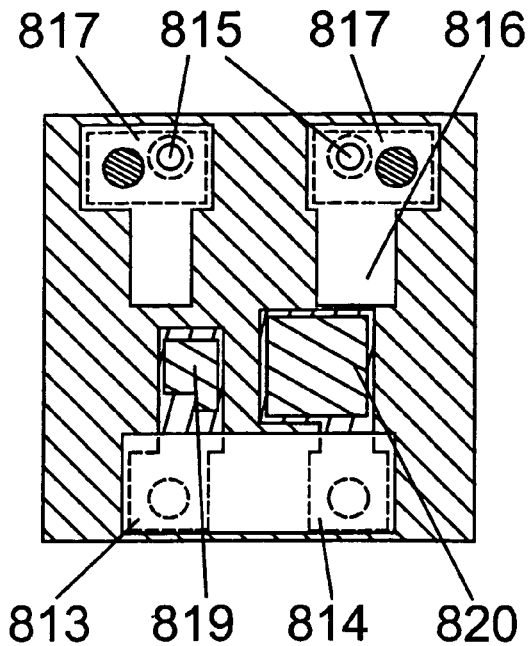
Fig. 8e
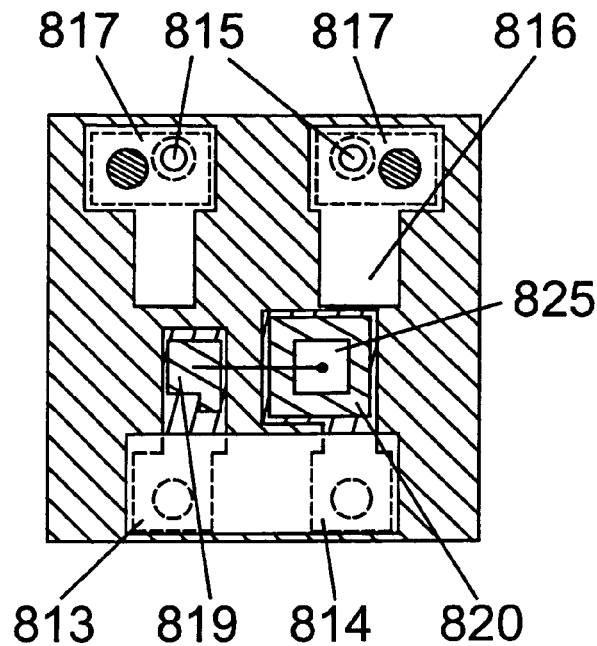
Fig. 8f
Back Face
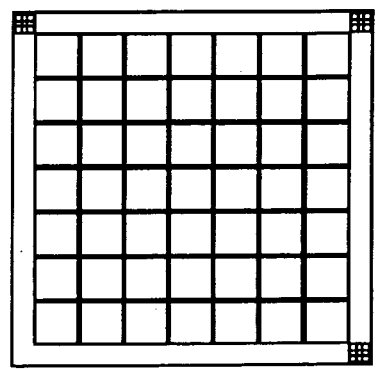
Fig. 8g
Fig. 8

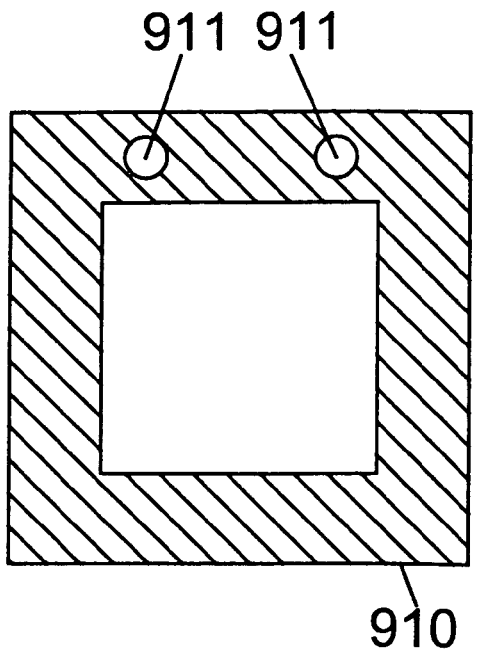
Fig. 9a
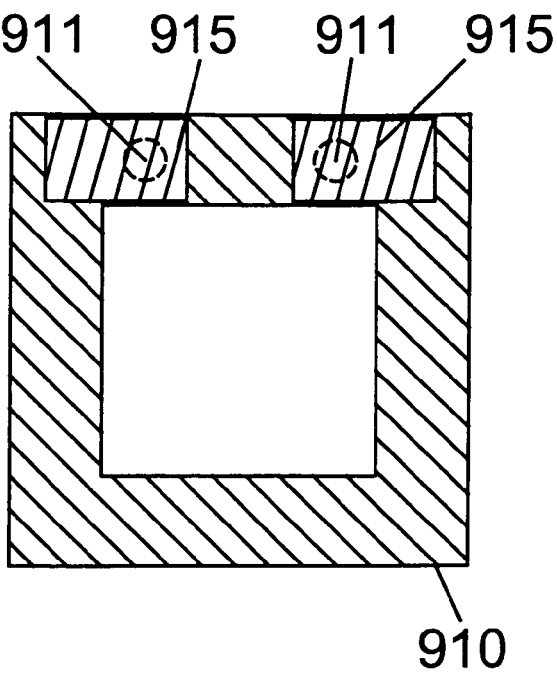
Fig. 9b
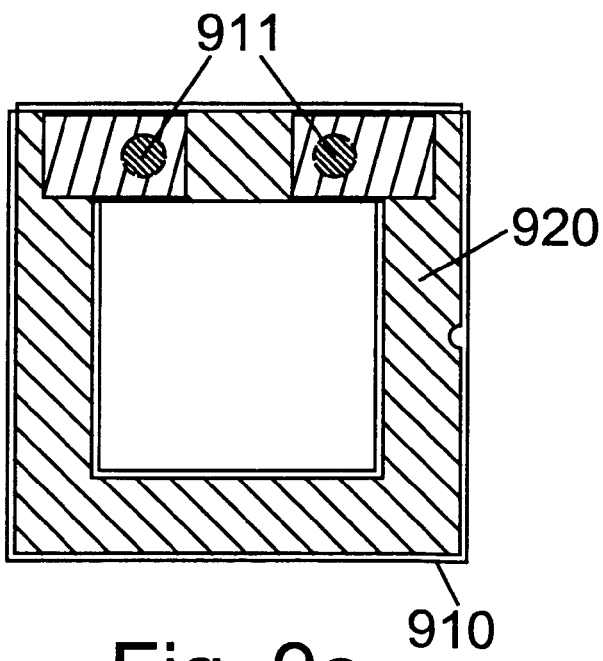
Fig. 9c
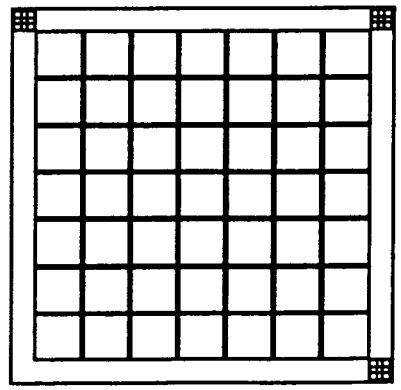
Fig. 9d
Fig. 9

HIGH DENSITY ELECTRONIC INTERCONNECTION

This application is a continuation-in-part of U.S. patent application Ser. No. 09/737,407 filed Dec. 15, 2000 now abandoned which claims the benefit of Provisional Application No. 60/170,975 filed Dec. 15, 1999, and also of Provisional Application No. 60/170,976 filed Dec. 15, 1999.

FIELD OF THE INVENTION

The invention is related to electronic interconnections and methods of forming bumped patterns for these interconnections.

BACKGROUND OF THE INVENTION

Ball grid arrays are made by coating a pad grid on the chip package with high temperature solder, (95% Pb/5% Sn). A glass template is provided with a hole grid corresponding to the pad grid. The holes are filled with copper balls coated with high temperature solder, and the high temperature solder is reflowed to join the balls to the pad. Subsequently, the ball grid package is attached to the next level assembly by a lower temperature solder, e.g. 60% Sn/40% Pb. Ball grid arrays require careful and precise control of soldering temperatures. Replacement or repair of packages having ball grid arrays also requires temperature control for package removal. Many hermetic packages have covers that are bonded to the package by sealing glass. The covers are sealed with sealing glasses at 360-450° C. Ball grid arrays for such packages cannot be made in advance, but must be added as the last step in making the package.

Micro-connection systems have been proposed for testing to produce "known-good-die" One proposed micro-connection system has microbumps on a copper clad polyimide substrate which are to be temporarily pressed against the die for testing purposes. A silicone rubber sheet backing the micro bumped polyimide surface transmits the contact pressure to the microbumps. These proposed microbumps are not suitable for permanent connections, or for hermetically sealed packages.

The Controlled Collapse Chip Connection (C4) is a method of flip chip mounting of semiconductor chips. In the C4 process, solder bumps are formed on a semiconductor chip. The solder bumps are used to connect the chip to its package, such as a single chip module (SCM) or multichip module (MCM). In the C4 process, first a glass passivation layer is formed on the chip with vias in the layer for the input/output contacts, I/Os. After DC sputter cleaning of the via holes, a thin circular pad of chromium is evaporated through a mask. The chromium pad covers the via and forms a ring around the via over the passivation layer sealing the via. The DC sputter cleaning assures low contact resistance to the aluminum I/O pad of the chip and good adhesion to the passivation layer. Next a phased chromium and copper layer is evaporated to provide resistance to multiple reflows in the subsequent processing. This is followed by a pure copper layer to form a solderable metal. A thin layer of gold is added as an oxidation protection layer for the copper. A thick deposit (100-125 μm) of high melting solder (97-95% Pb/3-5% Sn) is evaporated through a mask onto the chip and then heated to about 365° C. in a hydrogen atmosphere to fuse the solder into truncated spheres adhering to the pads. These solder bumps are fused to gold plated or solder coated pads on the interior surface of the chip package. The solder joints in the C4 design must be high enough to compensate for substrate non-planarity. Also because solder surface tension holds up the chip, a sufficient number of pads is required to support the weight of the chip. This is a concern with bulky, low I/O devices such as memory chips or chip carriers, where multiple dummy pads must be added to support the chip. For this reason, among others, the C4 process has been used for connecting semiconductor chips to a first level package, but has not been successful or widely used for connecting a package, which is substantially heavier than a chip to a higher level assembly.

SUMMARY OF THE INVENTION

The invention comprises a novel method of forming bumped substrates by forming the bumps and fusing them to the substrate simultaneously in one operation.

The present invention comprises a method of manufacturing an electronic interconnection means for interconnecting one or more conductors on one surface to one or more conductors on another surface. The interconnection means comprises convex metal bumps melted onto the conductors on the first surface, and capable of being bonded to the conductors on the second surface. The bumps being comprised of a metal that does not melt below 350° C., and is strong enough to hold the two surfaces a fixed distance apart.

In one embodiment the present invention comprises an improved method for manufacturing an electronic package having solderable metal bumps as a connecting means to another electronic package or a higher level assembly. The improvement comprises providing an insulating substrate having metallic pads on the base of the package; depositing a metal on the substrate over the metallic pads, the metal having a melting point over 350° C. and below the melting point of the metal forming the metallic pads; melting the metal so that it draws back onto the metallic pads, and forms metal bumps on the metallic pads.

In another embodiment, the invention comprises a method for manufacturing bumped conductors for electrically connecting one or more conductors on a first surface to one or more conductors on a second surface by providing contact areas in the conductive pattern on the first surface that are wettable by a molten metal. Then depositing the metal over the contact areas, and raising the temperature of the first surface above the melting point of the deposited metal. The metal melts, and the molten metal forms bumps on the contact areas. The bumps being comprised of a metal having a melting point over 350° C., and the bumps formed being capable of being bonded to the conductors on the second surface A further embodiment of the invention is a method of making electrical connections to electro mechanical devices by means of metal bumps on the conductive pattern of a ceramic substrate. The bumps both support the device and electrically connect it.

An additional embodiment of the invention is an connector to interconnect two or more electronic packages or assemblies. The connector comprises a planar, high temperature, insulating substrate with an interconnecting conductive pattern. The conductive pattern terminates in metal bumps capable of metallurgically bonding to contact pads of another assembly.

The invention also comprises a method of manufacturing an electronic package having a conductive pattern on the lid electrically connected to a conductive pattern on the base by depositing a metal over portions of one of the conductive patterns, melting the metal to form metal bumps or protuberances, and welding the protuberances to the other conductive pattern. The electronic package may comprise a lid, a frame and a base, and the conductive pattern of the lid is metallurgically bonded to the conductive pattern of the base and frame unit, or the conductive pattern of the lid is metallurgically bonded to a conductive pattern of the frame, and the conductive pattern of the frame is metallurgically bonded to the conductive pattern of the base, connecting the conductive pattern of the lid to the conductive pattern of the base.

Another embodiment of the invention is a method for electrically connecting one or more conductors on a first surface to one or more conductors on a second surface comprising melting a metal on the first surface to form metal bumps fused to the conductors on the first surface, the bumps being comprised of a metal having a melting point over 350° C., and welding the bumps on the conductors on the first surface to the conductors on the second surface. A sealant may be provided between the first surface and the second surface, and the metal bumps penetrate the sealant to weld to the conductors on the second surface.

DESCRIPTION OF THE DRAWINGS

FIGS. 8a-8g show plan views of the manufacturing stages for the base or photo detector layer of a miniature optocoupler package.

FIGS. 9a-9d shows preparation the ring frame layer of the optocoupler package.

DESCRIPTION OF THE INVENTION

Figure 1:
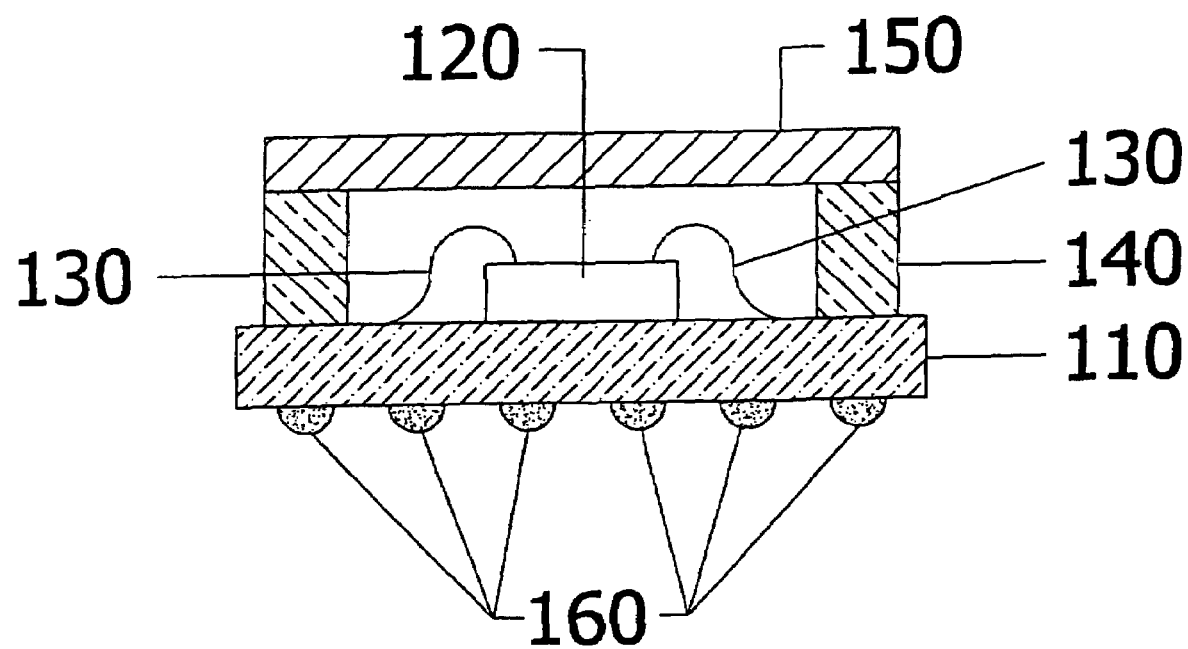
FIG. 1 is a cross section view of a chip-scale package according to the invention.

The interconnections of the present invention are by means of metal bumps on a high temperature insulating substrate. The bumps are formed by melting metals onto the contact pads on the substrate.

In the methods of this invention the conductive pattern of a substrate or base is provided with contact pads where the metal forming the bumps can be adhered when the metal is molten, and a background surface of the substrate where the molten metal is non-adherent. The contact pads can be metal pads or metallic sites capable of being wetted by the molten metal on a non-wettable background. The backgrounds include non-wettable metallic surfaces such as chrome or chrome alloys having a thin, non-wettable oxide layer, and non-wettable insulating surfaces and combinations of non-wettable surface background materials. Wettable areas are areas on the substrate surface where the molten metal adsorbs.

The bumps are formed by applying metal to areas of the substrate and melting the metal to form the bumps. The metal can be applied or deposited on the substrate by any suitable means such as plating, vacuum deposition, sputtering and the like, or as metal particles or powders, wires, films or foils. The metal is applied to the contact pads and may also be applied to contiguous background areas. The substrate is then heated to a temperature above the melting point of the metal and the surface tension of the molten metal draws it back from the contiguous background area forming a bump on the contact pad. The height of the bump depends on the volume of metal applied on the contact pad and also on the contiguous background area. Preferably the metal that is applied on each pad and the contiguous background area associated with it, is separated from neighboring areas and their contiguous metal deposits.

If the background surface is smooth, firm and non-wettable, the surface tension of the molten metal will draw back any metal applied to the contiguous area onto the contact pad. The surface tension of the molten metal may not be sufficient to draw all the metal from the contiguous areas if the contiguous background is rough, textured, or if the surface of the background softens at the temperature of the molten metal. In such cases it is advisable to apply all of the metal required to form the protuberance directly on the contact area with little or no overlap of the contiguous background area.

In one embodiment, the invention is a method of forming metal bumps on an electronic interconnecting substrate, the bumps being suitable for connecting to another electronic assembly. The bumps are formed by applying metal particles, films or foils to metallic pads on the substrate and melting the metal particles, film or foils to form the bumps on the metallic pads.

The invention also provides packages with bumped arrays for forming metallurgical bonds to another assembly. The packages are capable of being hermetically sealed.

A characteristic of the metal forming the bumps is a melting point above the temperature at which the package will be joined to another package or to another assembly. The conductors on the surface having the melted metal bumps are joined to the conductors on the second surface by metallurgically or adhesively bonding the bumps to the contact pads on the second surface. The metallurgical bonds can be formed by brazing, soldering, welding or the like. Welding techniques commonly used in the electronics industry include thermocompression bonding, ultrasonic bonding and thermal ultrasonic bonding. Soldering is the standard procedure by which electronic component packages are joined to other assemblies, such as ceramic circuits or laminated glass reinforced epoxy printed wiring boards. The soldering takes place at temperatures between 220° C. (425° F.) and 290° C. (550° F.), so the melting point of the metals forming the bumps should be over 350° C. (650° F.). The melting point of the metal forming the bumps must be below the melting point of the metal forming the metallic pads.

The bumps must be formed of a metal that has sufficient strength and rigidity to support the surface and prevent collapse when joining it to another surface or another assembly. The bumps should be high enough to compensate for non-planarity of the surfaces being joined, and strong enough to keep the surfaces apart to prevent short circuits, and to permit cleaning between the two surfaces. Preferably the bumps should support the package without addition of dummy bumps. The metal that is melted and melted to a substrate to form the bumps must adhere well to the metallic pads of the substrate.

Techniques for joining the bumped substrate to contact pads on another surface include adhesive and metallurgical bonding techniques. Adhesive bonding uses conductive organic materials and includes metal filled resins such as conductive epoxies, acrylics and polyimides. Metallurgical bonding techniques include welding, brazing, soldering, and the like. Welding techniques commonly used in the electronics industry include thermocompression bonding, ultrasonic bonding and thermal ultrasonic bonding. When the bumped substrate is to be joined to contact pads on another surface by thermocompression, ultrasonic or thermal ultrasonic techniques, the metal of the bumps may be gold or aluminum.

When the bumped substrate is to be joined to the contact pads on another surface by soldering, an important characteristic of the bumps is limited solubility in solder. If the metal dissolves in solder, the bumps may collapse. Also at soldering temperatures the bumps should not dissolve significantly in solder so as to weaken and/or embrittle the solder joints. If the bumps are formed of a metal that may be dissolved in solder, the bumps should be coated with a barrier layer such as nickel.

The bumps are formed of metals and alloys with melting points above 350° C. Preferred metals are copper and copper alloys such as copper/nickel, beryllium/copper, brasses and bronzes. Nickel and nickel alloys such as nickel/phosphorus alloys also may be used. Silver and silver alloys such as copper/silver, palladium/silver and gold and gold alloys such as gold/germanium and gold/silver platinum/gold alloys may be used. A barrier metal such as nickel or palladium may be used to reduce the solubility of the bumps in solder or prevent migration of the bump metal into the solder. To enhance the solderability of bumps coated with nickel or other barrier metal, a solder aid such as a thin layer of gold, tin or a flux may be applied to the barrier metal.

The substrate is preferably formed from a high temperature insulating material. Any insulating material may be used that will withstand the process of fusing the metal and forming the bumps on the substrate. Especially suitable high temperature insulating materials are ceramic and glass/ceramic compositions and silicon. Preferred materials comprise aluminum oxide, aluminum nitride, diamond, beryllium oxide, boron nitride, cordierite, mullite, silicon carbide silicon nitride and glass/ceramics.

The metallic pads are formed on the high temperature insulating material by any suitable means. On ceramic materials, thick film, thin film, cofired ceramic circuit or copper direct bond metallization techniques may be used. The metallic pads are composed of metals with melting points above the melting point of the bumps, and that will not melt, dissolve or lose adhesion to the insulating substrate when the metals forming the bumps are melted and fused to the pads. The metals for the metallic pads are selected from the group consisting of the metals of Groups 8 and 1b of the Periodic Table of Elements and the refractory metals such as chromium, molybdenum, tungsten and titanium. Preferred metals for the metallic pads are formed from thick film copper pastes, gold pastes, palladium/silver pastes and platinum/silver pastes. More preferred metals include tungsten, titanium-tungsten, chromium, molybdenum and nickel, and most preferred are combinations of molybdenum and manganese. A barrier material on the metallic pad, such as nickel or palladium may be used to limit the solubility of the metal of the bump into the metal comprising the metallic pad.

If the high temperature insulating material is used for an electronic package that will contain a semiconductor die, it may have electrical connections from the die to either metallic pads on its bottom or metallic pads on the same side as the die. The die may be connected to the package by wire bonds, or by a flip chip bonding. The connections to the bottom of the package may be through the substrate of the package as metallic vias when the package is a cofired multilayer ceramic, or by metal plugged vias in the substrate of the package. The connections also may be accomplished by edge metallization.

The metal or metal alloy that is melted onto the metallic pads may be applied to the substrate as a metal powder, by printing metal pastes, by evaporating metal onto the substrate, by applying a metal foil to the substrate, or other means. After the metal is applied to the substrate, it is heated to a temperature above its melting point. When the metal melts the surface tension of the molten metal causes the metal to draw back and ball up on the metallic pads.

Metal pastes applied using thick film screen printing techniques are one method of applying metal powder onto the metallic pads of the substrate. The pastes are formulated with metal powders dispersed in organic vehicles. E.g., a metal paste is prepared by dispersing 50-90% by weight metal powder in an organic resin/solvent vehicle. The metal paste is printed over each of the metallic pads on the substrate. The paste is dried and then the temperature ramped up to destroy the organic vehicle, leaving only the powder. The temperature is then raised above the melting point of the powdered metal, and the part is fired in a vacuum or an inert or reducing atmosphere The metal melts and draws back to the metallic pads forming rounded metal bumps.

In one embodiment, the metallic pads on the high temperature insulating substrate are covered by an organic adhesive and metal particles are applied to the adhesive. The adhesive is formulated so that it will decompose completely in the firing process. After the metal particles are applied, the substrate is heated above the melting point of the metal, so that the surface tension of the molten metal causes the metal to draw back and form bumps on the metallic pads.

The metals used to form the bumps may be applied to an insulating substrate by electroplating. The metallic pads may be electroplated by connecting them to the cathode of an electroplating cell. In another electroplating method, a layer of electroless metal is formed on a ceramic substrate including the metallic pads, and built up to a required thickness by electroplating, e.g., copper. An etch resist is applied over the electroplated metal, and the metal is etched to create an area of metal in contact with each metallic pads on the substrate. After the etch resist is removed the metal is heated to a temperature above the its melting point. When the metal melts the surface tension of the molten metal causes the metal to draw back, ball up on and fuse to the metallic pads.

In an alternative procedure, a plating resist is applied to the electroless metal layer described above, leaving exposed metal over each of the metallic pads. Copper is electroplated on the exposed areas. After the plating resist is removed, the underlying layer of electroless metal separating the electroplated areas optionally may be removed by a quick etch prior to melting the copper to form the bumps Metal foils, such as copper foils may be used to form the bumps over the metallic pads on the substrate. The foils may be laminated to the bottom of the substrate with an adhesive that decomposes during the firing. The foils may be perforated or porous to better vent the decomposing adhesive. Areas of metal overlapping the metallic pads may be formed by etching. Upon melting, these areas draw back and ball up forming bumps on the metallic pads. Alternatively the foil could be punched forming a pattern of islands joined by very narrow bands. The punched foil is positioned on the substrate with each punched island overlapping a metallic pad. When it is heated above the melting point of the foil, the narrow bands melt and act as cleavage points as the islands draw back to form bumps over and fuse to the metallic pads.

The height of the bumps is determined by the quantity of metal or alloy that is melted on each metallic pad. It would be obvious for one skilled in the art to select the volume of material over the metallic pad in order to obtain the desired bump height.

A package according to the invention is illustrated in FIG. 1. The package, shown in cross-section, has a base 110, a semiconductor device 120 connected by wire bonds 130 to the conductive pattern of the base, a frame 140, surrounding the device, which is closed by a cover 150. The conductive pattern includes vias connecting the top and bottom of the base. Melted metal bumps 160 formed on the bottom of the base are suitable for connecting the package to another assembly. The metal bumps of the interconnection package may be soldered to a printed wiring board, thus connecting the semiconductor device to the next level assembly.

Figure 2:
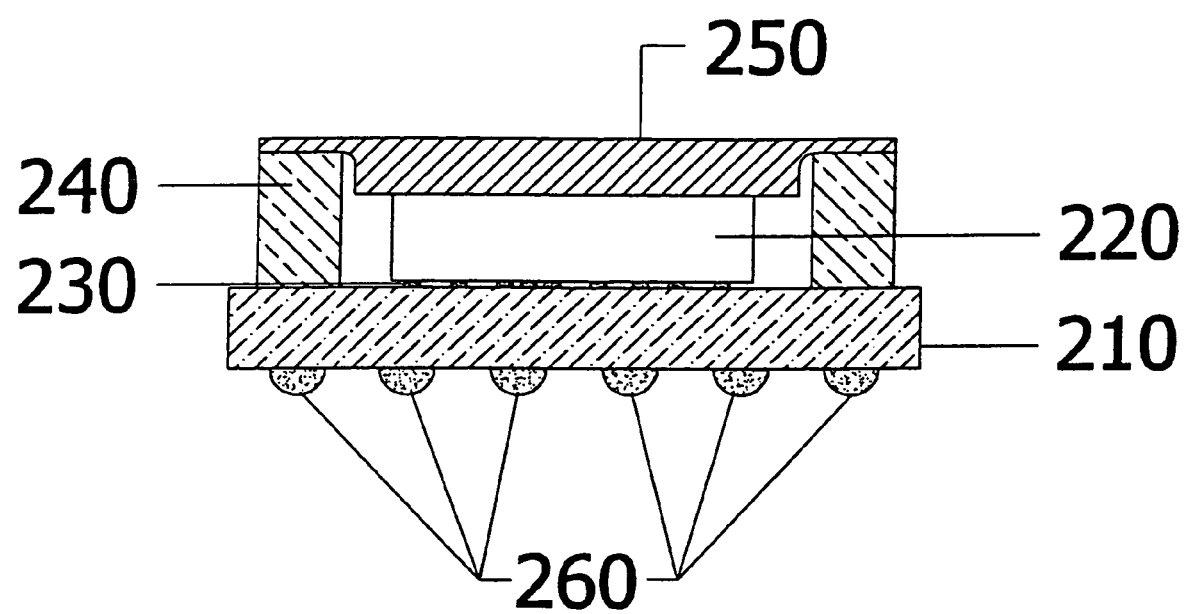
FIG. 2 is a cross section view of a flip chip package according to the invention.

A "flip-connection" package having melted metal bumps for connection to another assembly, is shown in FIG. 2. The metal bumps 260 are formed on the bottom of the ceramic base 210. The metal bumps are connected by the conductive pattern of the ceramic base and the flip-connections 230 to a semiconductor die 220. The semiconductor device is enclosed by a frame 240 and cover 250. Some methods for providing packages with flip connections are more fully described in U.S. Pat. Nos. 5,627,406, 5,904,499 and 6,613,605 which are incorporated herein by reference.

Figure 3:
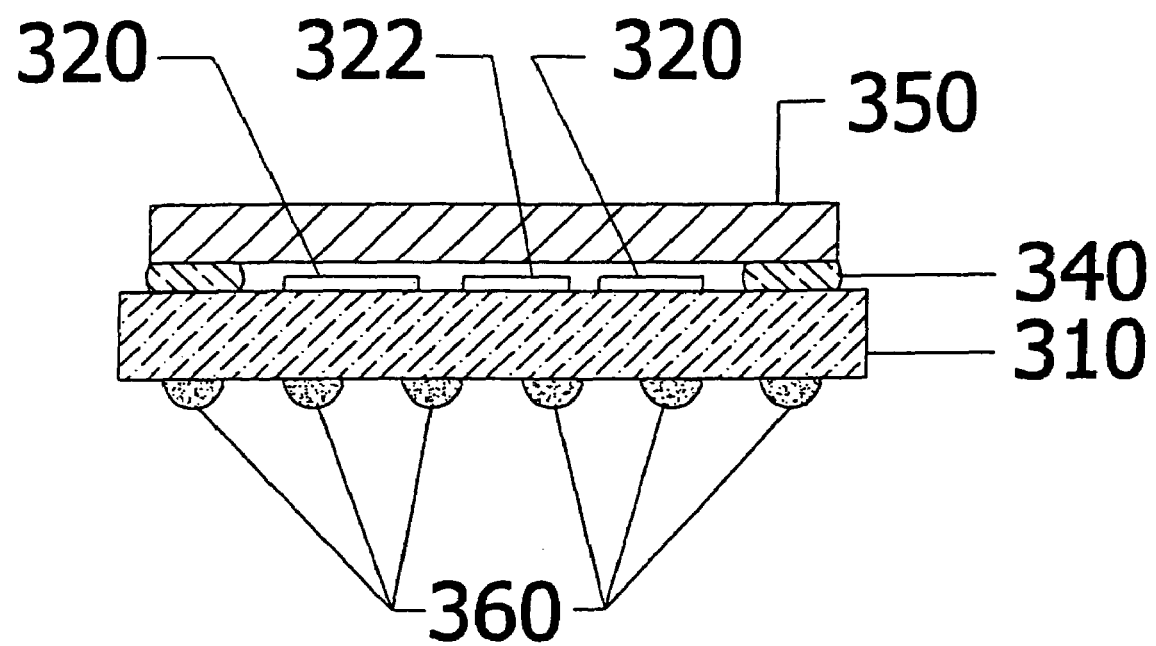
FIG. 3 is a cross section view of a multichip module with melted metal bumps as interconnection means

FIG. 3 illustrates a multichip module package with three electronic devices 320, 322 and 324 connected to the conductive pattern of a ceramic base 310. The ceramic base has melted metal bumps 360 on the bottom to serve as input/output interconnections for the module. A frame 340 mounted on the ceramic base, and a cover 350 is attached to the frame to enclose and protect the devices.

Figure 6:
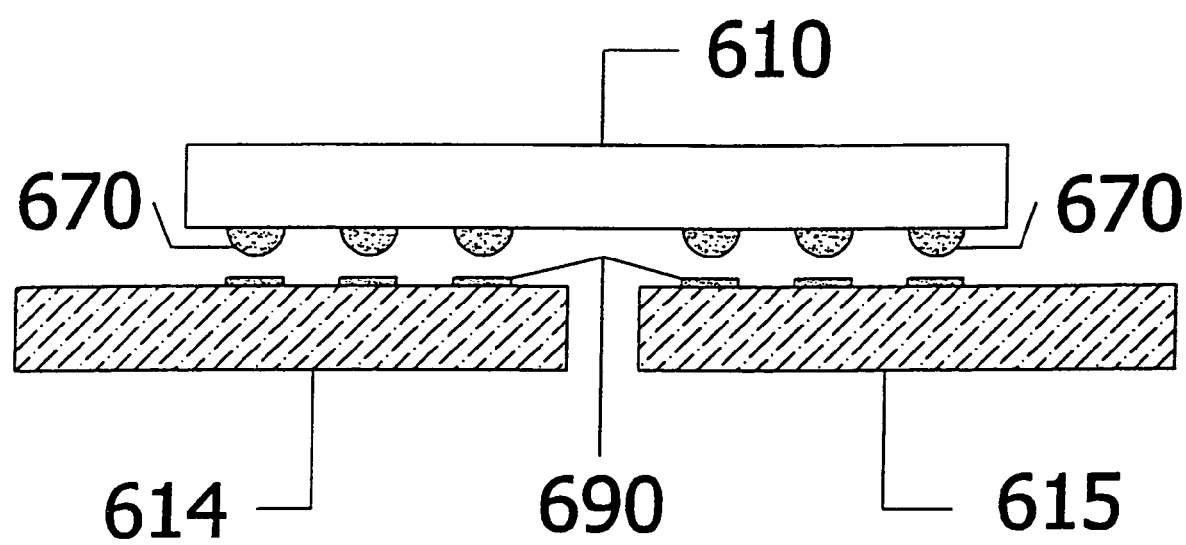
FIG. 6 is a side view of a connector interconnecting two adjacent packages.

FIG. 6 illustrates a connector interconnecting two side-by-side surfaces 614 and 615. The connector is an insulating substrate 610 with a grid array pattern 670. Metal bumps have been formed on the grid array by melting metal and fusing it to the grid array. The grid array pattern is interconnected by the conductive pattern (not shown) of the insulating substrate. The metal bumps are metallurgically bonded to the pads 690 on the conductive patterns (not shown) of the two side-by-side surfaces 614 and 615.

Figure 7:
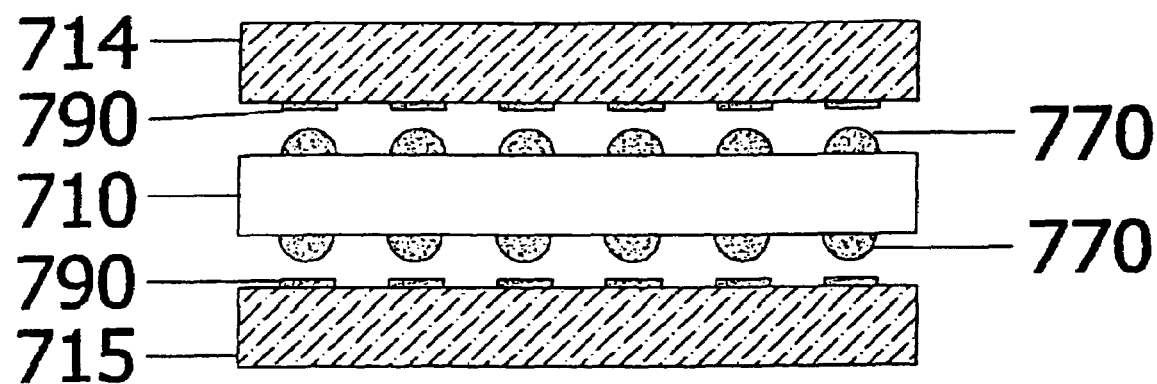
FIG. 7 is a side view of a second grid array metal bumped connector.

FIG. 7 shows another connector having an insulating substrate 710, with metal bumps 770 on both top and bottom surfaces. The metal bumps are connected by the conductive pattern of the insulating substrate. Two surfaces 714 and 715 are interconnected by being metallurgically bonded to the metal bumps of the connector. It would be obvious to those skilled in the art that the conductive pattern of the connector could be a simple through via pattern for direct interconnection of 714 and 715, or a more complex conductive pattern to interconnect any contact pad to any other desired contact pad.

In order to prepare an electronic package with conductive patterns on the lid, connected to the base, a ring frame is provided with a conductive pattern and conductors on the lid and ring frame are connected by metal bumps. The metal bumps are formed by melting a metal on a first surface, e.g. the lid, to form metal bumps fused to the conductors on the first surface. The bumps being capable of being bonded to the conductors on the second surface, e.g. the ring frame. Alternatively the metal bumps or protuberances may be formed on the ring frame and bonded to conductors on the lid. The ring frame and the base may be formed as one unit, or as two pieces. A separate ring frame and separate base are also joined by metal bumps. Hermetically sealed electronic packages are prepared with a lid, a base and a ring frame enclosing the electronic device. To join the lid, ring frame and base, a sealant is supplied between the lid and the ring frame and between the ring frame and the base. The lid and base are sandwiched together with the ring frame in between, heat and pressure would be applied to soften the sealant force the metal bumps through the sealant and make contact with the conductors underneath. Sufficient heat and pressure is applied to weld the metal bumps to conductors below. The sealant is solidified by cooling the package which has a complete conductive pattern from the lid to base through welded bumps.

The preferred lid and base are planar, rigid ceramic substrates. The preferred frame is prepared from similar substrates. The bumps are comprised of a metal having a melting point over 350° C. The preferred metals are selected from the group consisting of aluminum, copper, nickel, silver, gold, and alloys comprising these metals. A more preferred metal for forming the metal bumps the is selected from the group consisting of copper, silver, gold, copper alloys, silver alloys and gold alloys. Sealants are selected from the group consisting of inorganic materials and organic materials. Inorganic sealants include vitrified, non-devitrified glasses, and ceramic loaded glasses such as green ceramic tapes, low temperature cofired ceramics (LTCC) and high temperature cofired ceramics (HTCC). Organic sealants include thermosetting materials and thermoplastic materials. Sealing glasses are the preferred sealants for the hermetic, ceramic packages.

Figure 12:
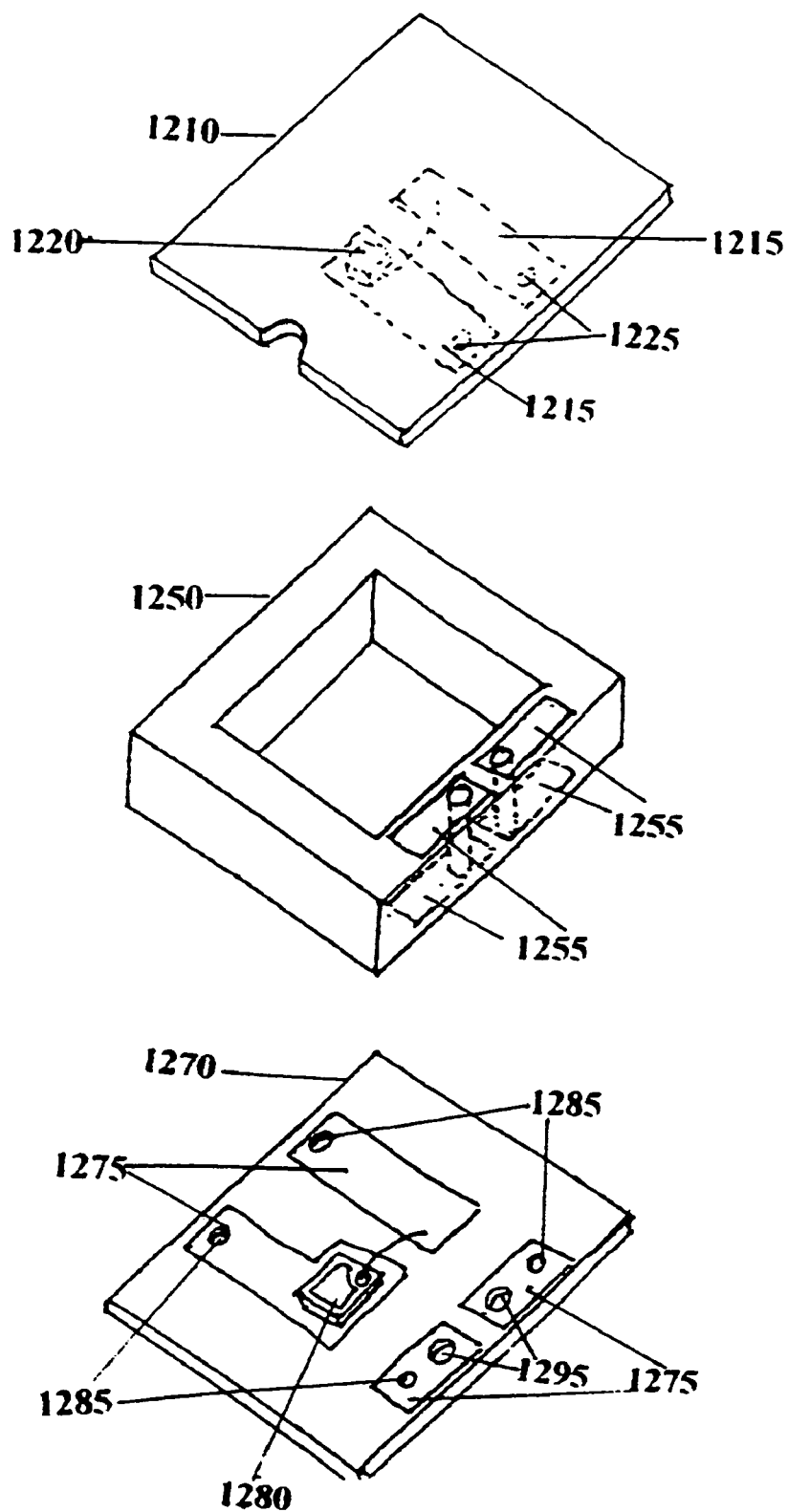
FIG. 12 is an isometric view of the components of an optocoupler package.

FIG. 12 is an exploded isometric view of a miniaturized hermetically sealed optocoupler. The optocoupler is assembled from three layers. The top layer is a photo emitter 1220 mounted on a lid 1210. The middle layer is a frame 1250, and the lower layer has a photo detector 1280 mounted on a base 1270. The substrates for the lid, frame and base are preferably made of an opaque ceramic insulating material such as black, 90% alumina. The lid is the photo emitter substrate. It has a conductive pattern 1215 on its lower surface terminating in metallized lands. Metal bumps 1225 are formed by melting a metal on the metallized lands. A ring frame 1250, which is open in the center, has a conductor pattern 1255 consisting of conductive through-holes connected to metallized lands on the top and bottom of the ring frame. The base 1270 has a conductive pattern of conductors 1275 on the upper surface connected by conductive plugged vias 1285 to lands on the bottom surface (not shown) which act as input/output contacts for the optocoupler. Metal bumps 1295 are formed by melting a metal on selected portions of the conductors on the upper surface. Then a photo detector 1280 is mounted on the top surface of the base. The lid, ring frame and base are assembled with the photo emitter facing the photo detector and the ring frame between. A sealant is supplied between the lid and the ring frame and between the ring frame and the base. Heat and pressure are applied to soften the sealant force the metal bumps of the lid and the base through the sealant, the bumps making contact with and welding to the conductors on the ring frame. Welding the metal bumps on the lid to the ring frame, and ring frame to the metal bumps on the base, connects the photo emitter to its input/output connections on the bottom of the package. The sealant is solidified by cooling the package.

The same procedures are applicable to manufacture of "cavity down" electronic packages. Very dense integrated circuits generate heat, which must be removed. In a most electronic packages the integrated circuit is mounted on the base of the package to facilitate the input/output connections to the next level of packaging. There is a small cavity between the integrated circuit and the lid spaced above it. This is called a "cavity up" package. However the heat is usually removed from the package with a heat sink attached to the lid. In the cavity up design the heat transfer, from the integrated circuit mounted on the base to mounted on the lid, is poor. Cavity down packages made by the methods of the present invention provide good heat transfer, and compact packages with input/output connections on the base of the package.

EXAMPLE 1

Figure 4:
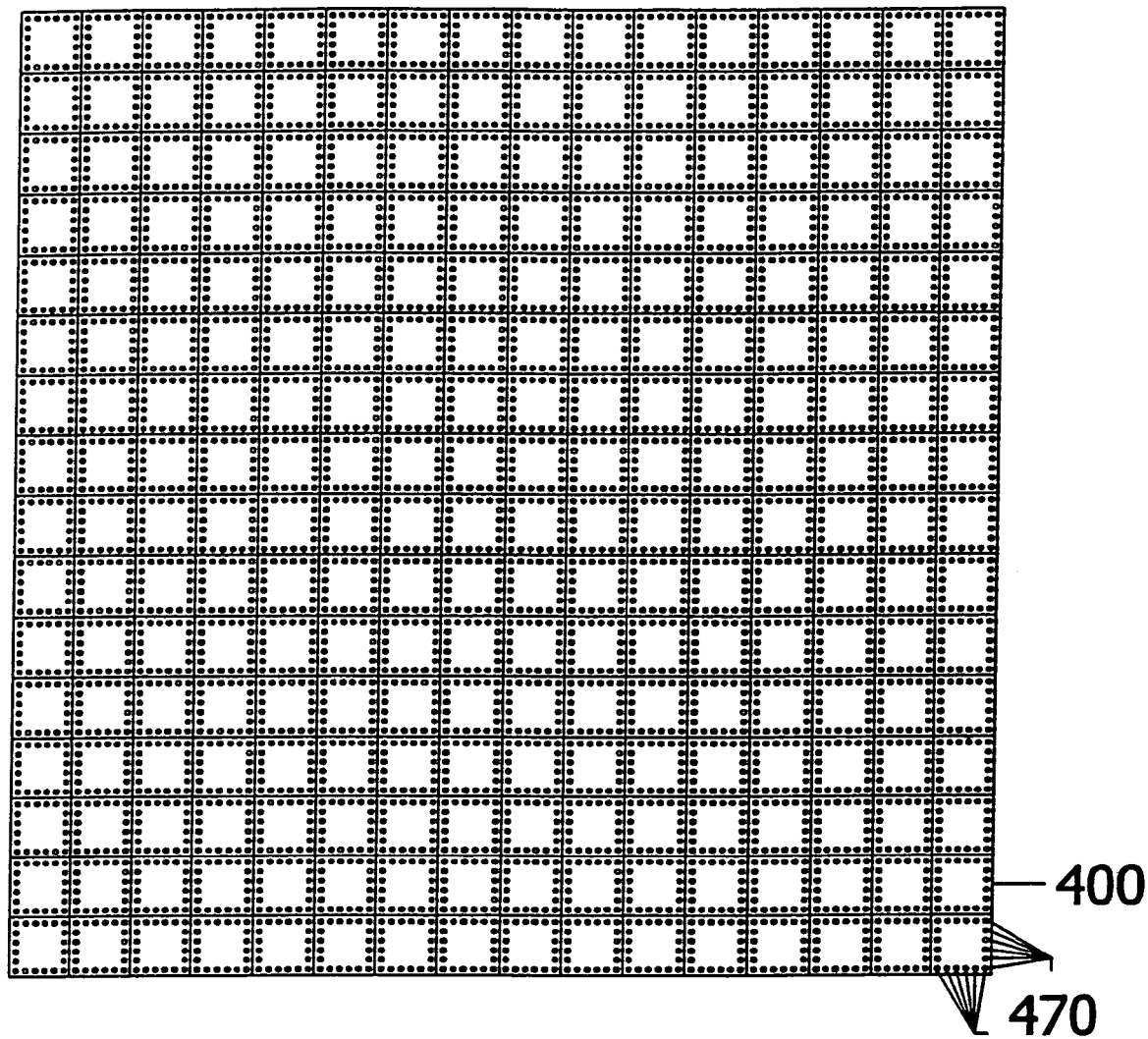
FIG. 4 is a plan view of a ceramic substrate having 256 grid arrays of the metal bumps of the invention.
Figure 5:
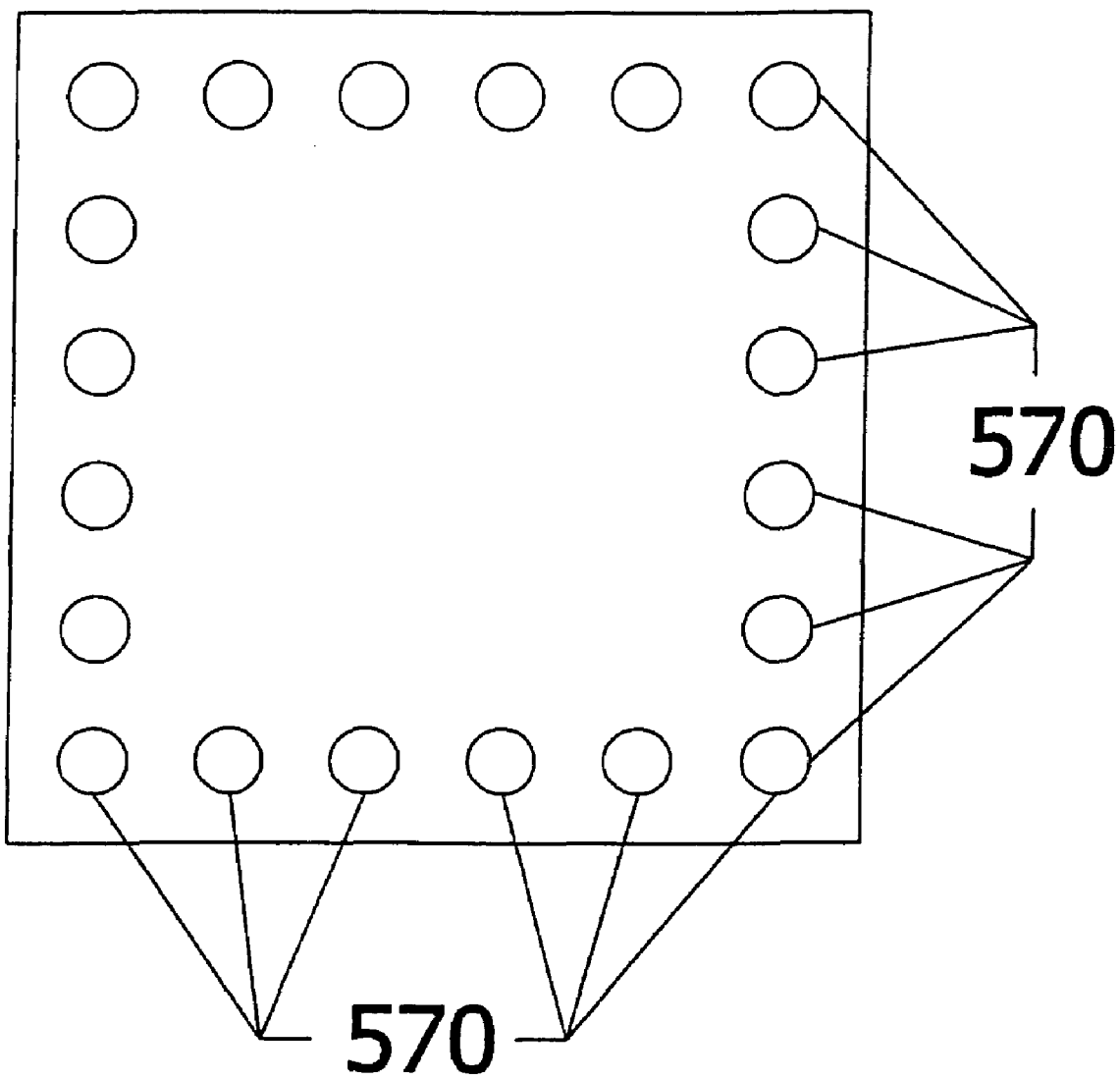
FIG. 5 is a plan view of a single grid array from FIG. 4.

Referring to FIG. 4, a 2 in.×2 in.×0.01 in. thick (50 mm×50 mm×0.25 mm) alumina substrate 400 was printed with a pattern simulating the connections of 256 chip scale packages. The chip scale package size was 0.125 in.×0.125 in. (3.175 mm×3.175 mm), and each simulated package had 20 pad connections 470. FIG. 5 shows an individual package with 20 pads 570. A tungsten paste, Tungsten Mix No. 3™ from Ceronics Inc., of New Jersey, was printed in 0.006 in. diameter (150 µm) pads on 0.020" (0.5 mm) centers. The paste pattern was fired in a hydrogen atmosphere at about 1350° C. forming metallic pads 0.006" (150 µm) in diameter.

A copper paste was prepared by dispersing 80% by weight copper powder in 20% by weight ethyl cellulose/terpineol vehicle. The copper paste was printed in oversize pads, 0.018" (0.46 mm) on 0.020" centers, where each pad overlapped a tungsten pad. The copper paste was dried, fired in a hydrogen atmosphere at a low temperature to decompose the organic vehicle, and then fired at a temperature above the melting point of copper. In the firing, the temperature was ramped up over 40 minutes to 1100° C.; held at 1100° C. for 30 minutes, and ramped down over a period of 30 minutes.

In the firing process the copper pads pulled back onto and balled up on the tungsten pads forming uniformly high copper bumps suitable for joining the alumina substrate to another electronic package or higher level electronic assembly by soldering or other means.

EXAMPLE 2

A 2" by 2" (50 mm×50 mm) alumina plate was printed with a molybdenum/manganese (Mo/Mn) paste in a pattern of 5120 pads, 0.006" (150 µm) in diameter. The pads were in 256 groups of 20 pads each on 0.020" (0.5 mm) centers as in Example 1. The Mo/Mn paste on the alumina was fired forming metallic pads 0.006" in diameter. A copper paste was screen printed over the metallic pads in a pattern of circles 0.018" (0.46 mm) on the same 0.020" (0.5 mm) centers as the metallic pads. The copper paste on the alumina was dried and then temperature was ramped up over 30 minutes to 1100° C. and held at 1100° C. for 35 minutes before slowly cooling down. The copper melted and the surface tension of the molten copper drew the copper back to form bumps 0.006" in diameter on the metallic pads.

The procedure was repeated with square, copper paste prints and long, narrow, rectangular, copper paste prints over the 0.006" diameter metallic pads. In all cases, after firing the copper drew back and formed smooth convex bumps over the metallic pads.

Since the copper pattern overlapping one metallic pad is preferably spaced apart from the pattern overlapping a neighboring metallic pad, long, narrow prints are well suited for applications where the metallic pads are so tightly spaced that one couldn't supply a sufficient volume of material using a circular or square pattern.

EXAMPLE 3

Forty-nine miniaturized optocoupler packages were manufactured on three 1 inch by 1 inch (25 mm×25 mm) black, 92% alumina ceramic sheets. The miniaturized optocouplers were in four leaded packages, with dimensions 0.120 inch by 0.120 inch (3.05 mm×3.05 mm).

The packages were laid out in a 7 by 7 layout to provide forty-nine packages from the three 1"×1" alumina sheets. The 0.120 inch packages were laid out on a 0.126 inch (3.2 mm) grid to allow 0.006 inch (0.15 mm) wide saw cuts to separate the individual packages.

FIG. 8 shows the preparation of the first alumina sheet for the base or photo detector layer of the optocouplers. The first alumina sheet was drilled with one hundred ninety-six holes, four for each 0.120 inch by 0.120 inch package 810 as shown in FIG. 8a. The holes 811 were plugged with a molybdenum/manganese paste to form conductive vias. Conductors 812 for back or outside of the base were screen printed with molybdenum/manganese paste as shown in FIG. 8b. The conductors 812 covered and made contact with the plugged conductive vias 811. Conductors 813, 814 and 815 for the front or top side of the base were printed with molybdenum/manganese paste as shown in FIG. 8c. The conductors 813, 814 and 815 also covered and made contact with the plugged conductive vias 811. The base or photo detector layer was fired forming a conductive pattern connecting the front and back.

The front or top side of the base was screen printed with a dielectric paste 816 as shown in FIG. 8d. The print covering the molybdenum/manganese lands 815 had openings 817 for formation of metal bumps on the lands. The dielectric paste was dried and fired.

Referring to FIG. 8e, a portion 820 of conductor 814 and a portion 819 of conductor 813 were coated with gold to serve as a pad for bonding the base of a photo detector die and as a wire bond pad for a wire from a photo detector die. Using an 0.008 inch (0.2 mm) thick stencil, a fritless thick film gold paste was printed over the openings in the dielectric layer 817 and dried. The alumina sheet was fired at 1100° C. The thick gold deposits over the openings 817 melted, drew back from the dielectric layer and formed convex, gold bumps or protuberances from the conductors 815. Forty-nine photo detector chips 825 were mounted on the gold die pads 820 in FIG. 8f, with a silver/glass. Each photo detector die was connected by a wire bond to its corresponding gold pad 819.

FIG. 8g shows the back face of the complete alumina sheet with forty-nine back conductor patterns.

FIG. 9 shows the ring frame layer of the optocouplers. Forty-nine square openings, 0.070 inch by 0.070 inch (1.78 mm×1.78 mm), were cut in the second alumina sheet or ring frame layer, which left a gridwork of 0.056 inch alumina strips on 0.126 centers. Holes were drilled in each grid of the 0.056 inch stripes left by cutting out the 0.070 inch by 0.070 inch square openings; as shown in FIG. 9a two holes were drilled each 0.120 inch by 0.120 inch package 910 for formation of conductive through-holes. The holes 911 were coated by a thick film palladium/silver paste. The ring frame layer was fired, forming conductive holes 911 with palladium/silver conductors. A conductive pattern for lands, FIG. 9b, 915, was screen printed with a gold paste on both the top and bottom surfaces covering both ends of the conductive vias 911. The land pattern 915 was dried, and fired. A thick film sealing glass paste was printed on both sides of the frame layer over the 0.056 inch wide grid, FIG. 9c, 920. The paste was dried and fired at 390° C. FIG. 9e shows the complete alumina sheet with forty-nine square openings, 0.070 inch by 0.070 inch (1.78 mm×1.78 mm), forty-nine sets of conductive through-holes 911, and the forty-nine sets of lands 915.

Figure 10:
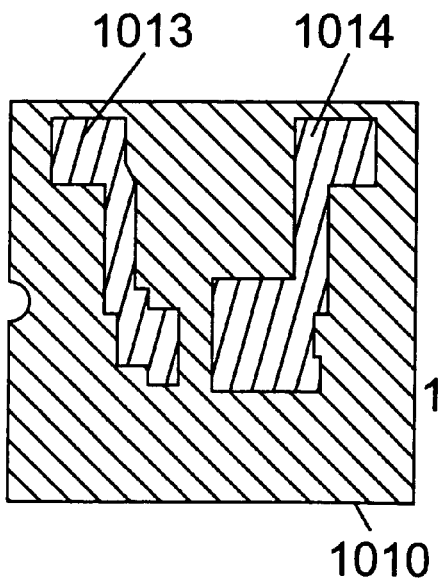
FIGS. 10a-10e shows stages for manufacturing the lid or photo emitter layer of the optocoupler package.
Figure 10:
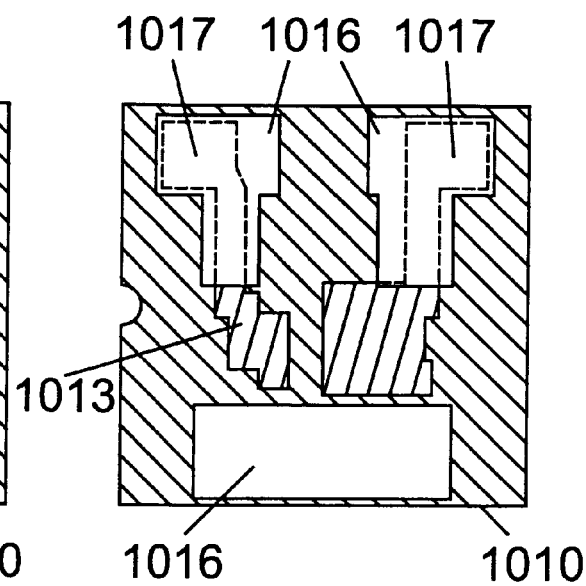
Figure 10:
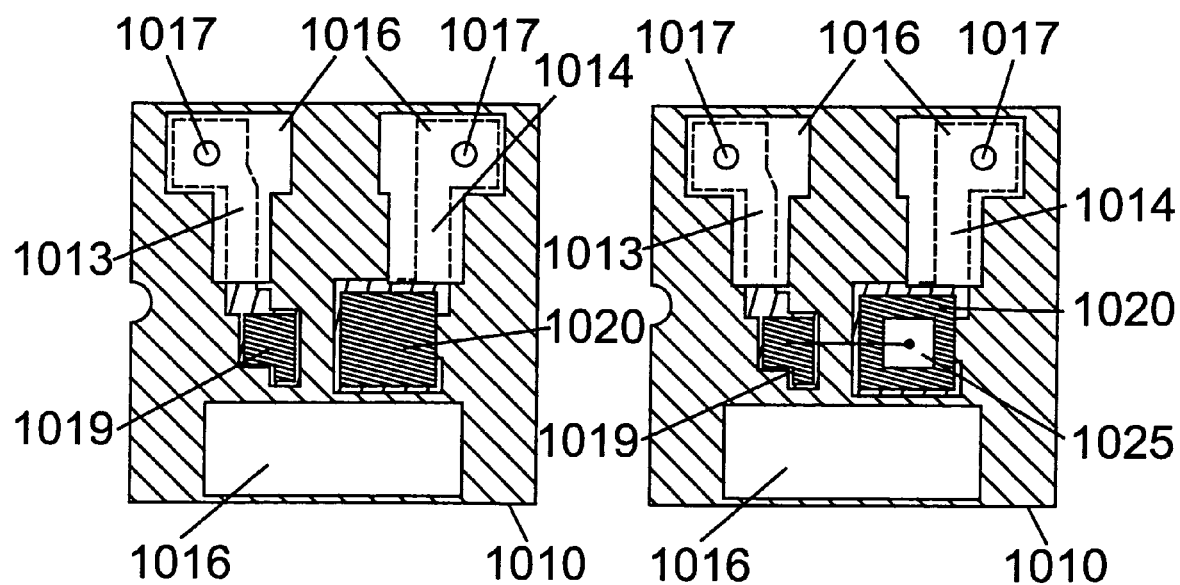

FIG. 10 shows the preparation of the alumina sheet for the lid or photo emitter layer of the optocouplers. FIG. 10a shows a conductive pattern 1013 printed with molybdenum/manganese paste on the inside of lid 1010. There were forty-nine patterns corresponding to FIG. 10a on the alumina sheet. The conductive pattern was dried, and fired. The lid was screen printed with a dielectric paste 1016 as shown in FIG. 10b. The dielectric layer had openings 1017 for formation of metal bumps on the conductive pattern. The dielectric paste was dried and fired. Referring to FIG. 10c, portions 1020 of the conductive pattern 1013 were coated with gold to serve as pads for bonding and wiring a photo emitter die. Using an 0.008 inch (0.2 mm) thick stencil, a fritless thick film gold paste was printed over the openings 1017 in the dielectric layer and dried. The alumina sheet was fired at a temperature higher than the melting point of gold, 1100° C. melting the thick gold deposits over the openings 1017. The molten gold drew back from the dielectric layer forming rounded metal bumps or protuberances from the conductive pattern 1013. Forty-nine photo emitter chips 1025, one for each 0.120"×0.120" package, were affixed to the gold die pads 1020 in FIG. 10d with a silver/glass paste (low melting glass with a high silver concentration), and wire bonded.

Figures 10, 10E:
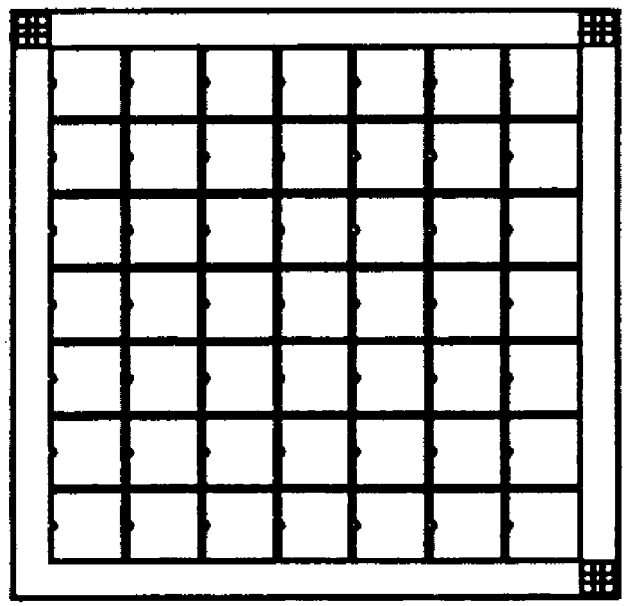

FIG. 10e shows the complete alumina sheet with forty-nine conductive patterns.

The three layers of FIG. 8f, FIG. 9e and FIG. 10d were assembled together and fired at 425° C. under pressure reflowing the sealing glass on the middle layer to seal all three layers together, and simultaneously forcing the gold protuberances 817 on lands 815 on base or photo detector alumina sheet and protuberances 1017 on conductors 1013 on the lid or photo emitter alumina sheet through the layer of sealing glass to thermocompression bond to lands 915 of the middle alumina sheet. At the same time the silver/glass fuses bonding the bases of the photo detector and photo emitter dice to the gold plated molybdenum/manganese conductors 820 and 1020.

The assembled packages were cut apart into forty-nine individual packages with a diamond saw. The packages passed all electrical and hermetic tests. A uniform, repeatable, thickness for the sealing glass was an unexpected advantage. The height of the gold bumps determines the thickness of the sealing glass and prevents squeezing the sealing glass out of joints between the ring frame and the top and bottom of the package.

In an alternate procedure ring frame and the detector layer or base would be prepared as green ceramics. The conductive patterns, including the conductive vias in both the frame and the base, would be applied as refractory metal pattern. The frame and the base would be joined together and fired forming a single unit. Gold lands would be deposited over the conductive vias on the top of the frame. The emitter layer or lid would be prepared as described above, and the gold bumps of the lid welded to the gold lands of the frame by thermocompression bonding. In another alternate procedure, instead of forming the base and frame from green ceramics and firing them together to form a single unit, the lid and the frame would be formed of green ceramics and fired together to form a single unit. The base would then be joined to the frame by thermocompression bonding of metal bumps to metal lands. The bumps could be on either the frame or the base.

EXAMPLE 4

Figure 11:
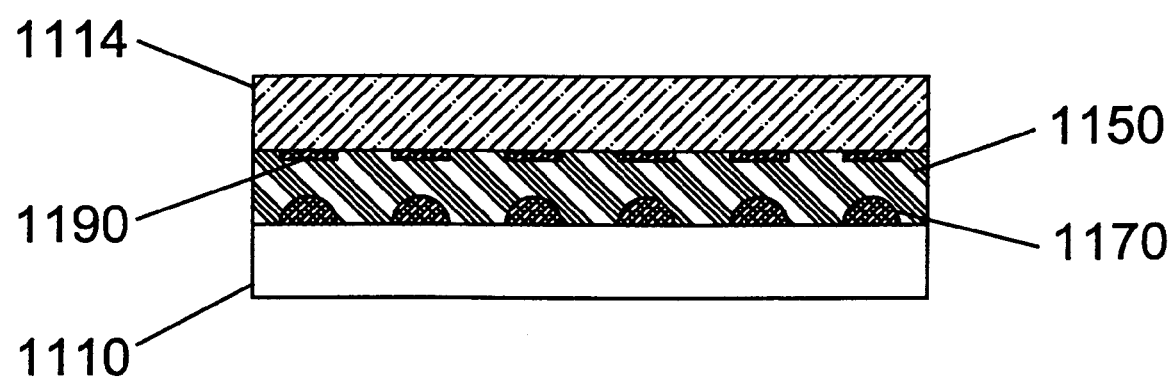
FIG. 11 is a side view of a resistor network package.

Two substrates or forming a resistor network are shown in FIG. 11. One deck 1110 is provided with metal bumps or protuberances 1170 by melting metal on metallic lands. The other deck 1114 is provided with corresponding metal lands 1190. The two decks are sandwiched together with a sealant, e.g. a sealing glass, between them. The two decks are pressed together heated to a point sufficient to liquefy or cure the sealant and weld the metal bumps to the metal lands by a thermocompression bond. The assembly is cooled to solidify the sealant and provide a rugged, compact hermetically sealed package.

It will be obvious to those skilled in the art that the melted metal bumps may be used to interconnect packages having a single layer or multilayer conductive patterns. Likewise the invention is applicable to packages containing more than one semiconductor chip, or a package containing multiple semiconductor circuits on a single die, wafer or section of a wafer.

I claim:

1. A method of manufacturing a hermetically sealed electronic package, the electronic package comprising a lid, a frame and a base; the electronic package having a conductive pattern on the lid, the conductive pattern of the lid including at least one component, the conductive pattern of the lid being metallurgically bonded to a conductive pattern of the frame, and the conductive pattern of the frame being metallurgically bonded to a conductive pattern on the base by depositing a metal, having a melting point over 350° C., over portions of a first conductive pattern, melting the metal to form metal bumps or protuberances, and metallurgically bonding the protuberances to a second conductive pattern.

2. A method according to claim 1 wherein the electronic package comprises a lid, a frame and a base, the base and frame being a single unit, and the conductive pattern of the lid is metallurgically bonded to the conductive pattern of the base and frame unit.

3. A method according to claim 1 wherein the metal bumps are metallurgically bonded to the second conductive pattern by a welding process selected from the group consisting of thermocompression, ultrasonic and thermal ultrasonic bonding.

4. A method of manufacturing a hermetically sealed electronic package, the package having three sections: a base, a ring frame joined to the base, the ring frame surrounding an electronic device, and a lid joined to the ring frame, the improvement comprising:

providing the base, ring frame and lid with conductive patterns;

depositing a metal, having a melting point over 350° C., on a selected portion of the conductive pattern of the first section, and melting the metal and cooling the molten metal to form metal bumps;

coating the second section with a sealant which covers metal lands of the conductive pattern;

positioning the first section with the metal bumps opposing the metal lands of the second section;

joining at least two of the sections together by raising the temperature to soften the sealant while raising the pressure and metallurgically bonding the metal bumps of the first section to the metal lands of the second section thereby joining the conductive pattern of the first section to the conductive pattern of the second section.

5. A method according to claim 4, wherein the metal of the metal bumps is selected from the group consisting of aluminum, copper, nickel, silver, gold, and alloys comprising these metals.

6. A method of manufacturing an electronic package according to claim 5, wherein the metal forming the bumps is selected from the group consisting of copper and gold.

7. A method according to claim 4, wherein the frame and the base are provided as a unit and the frame/base unit is joined to the lid.

8. A method according to claim 4, wherein the frame and the lid are provided as a unit and the frame/lid unit is joined to the base.

9. A method according to claim 4, wherein the sealant is glass.

10. A method according to claim 4 wherein the metal bumps of the first section are metallurgically bonded to the metal lands of the second section by a welding process selected from the group consisting of thermocompression, ultrasonic and thermal ultrasonic bonding.

11. A method for manufacturing a "cavity down" electronic package comprising:

providing a base, the base having a conductive pattern with input/output connections for the package, the conductive pattern including conductive vias to metal conductors on the other side which terminate in metal bumps, formed by melting a metal on portion of the conductive pattern, the bumps being comprised of a metal having a melting point over 350° C.;

providing a lid with a conductive pattern and an electronic component attached to the conductive pattern, the conductive pattern terminating in metal bumps formed by melting a metal on portion of the conductive pattern, the bumps being comprised of a metal having a melting point over 350° C.;

providing a frame having a conductive pattern comprising metal lands on its upper and lower surface and conductive vias connecting the lands;

coating the frame with a sealing glass, the sealing glass softening in a temperature range below the melting point of the metal of the metal bumps;

placing the frame, lid and base together with the frame between the lid and the base;

raising the temperature and applying pressure to soften the sealing glass and metallurgically bond the metal bumps lid and the base to the metal lands of the frame, and cooling to solidify the sealing glass, forming a hermetically sealed electronic package.

12. A method according to claim 11, wherein the metal of the metal bumps is selected from the group consisting of aluminum, copper, nickel, silver, gold, and alloys comprising these metals.

13. A method according to claim 12, wherein the metal forming the bumps is selected from the group consisting of copper and gold.

14. A method according to claim 11 wherein the metal bumps of the lid and the base are metallurgically bonded to the metal bumps to the metal lands of the frame by a welding process selected from the group consisting of thermocompression, ultrasonic and thermal ultrasonic bonding.

15. A method for manufacturing an optocoupler comprising:

providing first and second ceramic substrates having conductive patterns;

depositing a metal, having a melting point over 350° C., on selected portions of the conductive patterns of the first and second substrates, and melting the metal to form the metal bumps on the conductive patterns;

mounting a photo emitter on a first one of the ceramic substrates;

mounting a photo detector on a second of the ceramic substrates;

providing a ceramic ring frame, the ring frame having a conductive pattern of metal lands on each side connected by conductive vias;

bonding the first and second ceramic substrates to the ring frame with a sealing glass, and applying sufficient heat and pressure to metallurgically bond the metal bumps on the first and second ceramic substrates to the metal lands of the ring frame.

16. A method according to claim 15, wherein the metal forming the bumps is selected from the group consisting of copper and gold.

17. A method according to claim 15 wherein the metal bumps are metallurgically bonded to the second conductive pattern by welding process selected from the group consisting of thermocompression, ultrasonic and thermal ultrasonic bonding.

18. A method for manufacturing an optocoupler comprising:

providing a ring frame and a base layer of green ceramics having refractory metal conductive patterns including conductive vias;

joining the frame and base layer together and firing, forming a first single ceramic substrate;

depositing metal lands over the conductive via on the top of the frame;

providing a second ceramic substrate as a lid, the lid having a conductive pattern suitable for mounting a photo-active device, and lands suitable for mating with the metal lands of the frame;

depositing a metal, having a melting point over 350° C., on lands of the conductive patterns of the lid and melting the metal to form the metal bumps on the conductive pattern;

mounting a photo emitter on one of the ceramic substrates;

mounting a photo detector on the other second of the ceramic substrate;

bonding the lid to the ring frame with a sealing glass, and applying sufficient heat and pressure to metallurgically bond the metal bumps on the lid to the metal lands of the ring frame.

19. A method according to claim 18, wherein the metal forming the lands on the ring frame is selected from the group consisting of copper and gold.

20. A method according to claim 18, wherein the metal forming the bumps is selected from the group consisting of copper and gold.

* * * * *